(12) United States Patent
Bory et al.

(10) Patent No.: US 11,322,633 B2
(45) Date of Patent: May 3, 2022

(54) OPTOMECHANICAL SYSTEM FOR ABSORBING LIGHT OR EMITTING LIGHT AND CORRESPONDING METHOD

(71) Applicant: Insolight SA, Lausanne (CH)

(72) Inventors: Noé Bory, Lausanne (CH); Florian Gerlich, Lausanne (CH); Laurent Coulot, Lausanne (CH); Mathieu Ackermann, Lausanne (CH)

(*) Notice: Subject to any disclaimer, the term of this patent is extended or adjusted under 35 U.S.C. 154(b) by 77 days.

(21) Appl. No.: 16/465,829

(22) PCT Filed: Dec. 5, 2017

(86) PCT No.: PCT/EP2017/081553
§ 371 (c)(1),
(2) Date: May 31, 2019

(87) PCT Pub. No.: WO2018/104318
PCT Pub. Date: Jun. 14, 2018

(65) Prior Publication Data
US 2020/0098944 A1  Mar. 26, 2020

(30) Foreign Application Priority Data
Dec. 5, 2016 (CH) .................... 01591/16

(51) Int. Cl.
*H01L 31/054* (2014.01)
*G02B 26/08* (2006.01)
*H01L 33/58* (2010.01)
*H01L 33/60* (2010.01)

(52) U.S. Cl.
CPC ...... *H01L 31/0543* (2014.12); *G02B 26/0816* (2013.01); *G02B 26/0875* (2013.01); *H01L 31/0547* (2014.12); *H01L 33/58* (2013.01); *H01L 33/60* (2013.01)

(58) Field of Classification Search
None
See application file for complete search history.

(56) References Cited

PUBLICATIONS

Machine Transition FR 2948818, accessed Mar. 26, 2021 (Year: 2011).*

* cited by examiner

*Primary Examiner* — Shannon M Gardner
(74) *Attorney, Agent, or Firm* — Pearne & Gordon LLP

(57) ABSTRACT

An optomechanical system for absorbing light or emitting light, comprising as static frame element, an optical arrangement, a light absorbing/emitting substrate and a shifting mechanism. The shifting mechanism moves at least one layer of the optical arrangement relative to the light absorbing/emitting substrate or vice versa, wherein the movement is through one or more translation element relative to the static frame element in such a way that the transmitted light can be optimally absorbed by the light absorbing/emitting substrate, or that the incident light emitted by the light absorbing/emitting substrate can be optimally transmitted by the optical arrangement. Furthermore, the present invention also relates to a corresponding method for absorbing light or emitting light with the aforementioned optomechanical system.

19 Claims, 15 Drawing Sheets

OPTOMECHANICAL SYSTEM FOR ABSORBING LIGHT OR EMITTING LIGHT AND CORRESPONDING METHOD

TECHNICAL FIELD OF THE INVENTION

The present invention relates to the technical field of optical systems, more specifically the technical field of optomechanical systems. In particular, the present invention relates to an optomechanical system for absorbing light or emitting light and the corresponding method. Such optomechanical systems can in particular be used in an advantageous way not only in construction of solar panels for production of solar electricity, but also in controlling the light output of luminaires based on light sources such as LEDs.

BACKGROUND OF THE INVENTION

A photovoltaic cell (PV cell) is a specialized semiconductor diode that converts visible light into direct current (DC). Some PV cells can also convert infrared (IR) or ultraviolet (UV) radiation into DC electricity. Photovoltaic cells are an integral part of solar-electric energy systems, which are becoming increasingly important as alternative sources of utility power.

Increasing the conversion efficiency from solar energy to electricity is desirable to lower the cost of solar electricity and make it competitive with other energy sources such as fuel. However, the efficiency of standard silicon solar cells is limited to about 20-25%. Alternative photovoltaic technologies based on multi-junction solar cells are much more efficient (they achieve more than 40% efficiency), but they are way too expensive to be used as a direct substitution.

One solution which was proposed for making the use of high efficiency photovoltaic cells affordable is the so-called Concentrated Photo Voltaic (or CPV). The CPV systems make use of a concentration of the incident sunlight on a photovoltaic cell of smaller surface area, reducing thereby the overall costs of material. Thanks to this technique, it becomes possible to use the best existing photovoltaic cell technologies. The concentration of the sunlight makes it possible to reduce the overall surface area covered by the photovoltaic cells, without reducing the quantity of the generated electrical power. The solar concentrators make use of optical components, such as lenses or mirrors, which offer potential for further costs reductions. Consequently, CPV systems make it possible to generate electricity at a smaller cost of production than with conventional photovoltaic cells made of silicon.

However, the drawback of a CPV system is that according to the "étendue" principle, the higher the light concentration factor, the lower the angular acceptance. The movement of the sun over the day and over the seasons results in large variations of incidence angles along two axes, namely azimuth and elevation. A conventional concentrator with a fixed orientation requires therefore wide acceptance angles to cover these variations, and will therefore only achieve relatively small concentration factors. In order to achieve significant concentration factors, a solar tracking mechanism is required to accurately align the CPV system towards the sun.

Solar trackers are devices used to orient photovoltaic panels, reflectors, lenses or other optical devices toward the sun. Since the sun's position in the sky changes with the seasons and the time of day, trackers are used to align the collection system to maximize energy production. There are many types of solar trackers, of varying costs, sophistication, and performance. The two basic categories of trackers are single axis and dual axis. Single axis solar trackers can either have a horizontal or a vertical axis. Dual axis solar trackers have both a horizontal and a vertical axis and thus they can track the sun's apparent motion virtually anywhere in the sky.

However, the external single axis and dual-axis trackers are large, heavy and with very complex structures. They require frequent maintenance and have reliability issues related to wind load or humidity. Moreover, due to their size, weight and form factor, these trackers cannot be mounted on rooftops and thus cannot address the need of solar panels for the residential market, where high efficiency is key due to the limited area available.

On another hand, LEDs panels are progressively replacing other types of light sources for energy efficiency and reliability reasons. By nature, LED panels are distributed light sources, with a plurality of quasi-punctual sources spread on a wide and rather planar substrate. Moving or tilting each individual light source is not practical. Moving or tilting the entire panel is space consuming, and requires powerful motorization and complex mechanics. Hence, it is not applicable to all use cases, such as luminaires recessed in the ceiling.

Therefore, there is a need for an optomechanical system with high efficiency and wide acceptance angles to track and absorb the incident light emitted by a moving external source (e.g. the sun), or to adjust the directionality and orientation of the light beam emitted by an internal light source (e.g. an array of LEDs).

Furthermore, there is a need for an optomechanical system that moves only within a limited volume, in such a way that it is suitable for integration into a solar panel or a planar luminaire. More specifically, this implies that the system should not rotate, but move only in translation, with shorts strokes.

Lastly, there remains a need for a system which is reliable and requires a minimal maintenance over an extended lifetime. For instance, in the case of a solar panel, a system with at least 20 years of lifetime is expected. For lighting applications, the lifetime is typically shorter compared to solar panels, but the duty cycle can be higher, resulting in similar requirements.

SUMMARY OF THE INVENTION

Thus, the object of the present invention is to propose a new optomechanical system and a corresponding method for absorbing light or emitting light, in which the above-described drawbacks of the known systems and methods are completely overcome or at least greatly diminished.

An object of the present invention is in particular to propose an optomechanical system and a corresponding method for absorbing light or emitting light, thanks to which it is possible to optimally capture and alter the orientation of the externally generated and internally generated incident light.

It is also an object of the present invention to capture incident light from external or internal sources, and alter the path of the transmitted light in such a way that it can be either optimally absorbed or emitted. More specifically, the object of the present invention is to adjust the orientation and degree of convergence of the transmitted light to either maximize absorption or achieve the desired emission patterns.

According to the present invention, these objects are achieved in particular through the elements of the two independent claims. Further advantageous embodiments follow moreover from the dependent claims and the description. Features disclosed herein in different embodiments can also be combined easily by a person who is skilled in the art.

In particular, in a first aspect, the objects of the present invention are achieved by an optomechanical system for absorbing light or emitting light, comprising

- a static frame element,
- an optical arrangement comprising one or more optical layers capable of capturing incident light and transmitting transmitted light, wherein the optical arrangement is arranged to be able to capture the incident light from within and/or outside of the static frame element,
- a light absorbing/emitting substrate comprising one or a plurality of absorbing/emitting elements capable of absorbing the transmitted light or emitting the incident light, and
- a shifting mechanism for moving at least one of the layers of the optical arrangement relative to the light absorption/emission element or vice versa, wherein the shifting mechanism is arranged to move at least one of the layers of the optical arrangement or the light absorbing/emitting substrate translationally by means of one or more translation elements, in such a way that the transmitted light can be optimally absorbed by the light absorbing/emitting substrate, or that the incident light emitted by the light absorbing/emitting substrate can be optimally transmitted by the optical arrangement, and wherein the shifting mechanism further comprises one or more guiding elements capable of limiting the degrees of freedom of the one or more translation elements.

Thanks to the present invention, it is possible to optimally capture and transmit externally generated and internally-generated incident light. The present invention also allows for achieving higher efficiency of absorbing incident light with respect to previously proposed solutions, and to accurately control the orientation and degree of convergence of the light output from planar luminaires such as LED panels. In these examples, the light absorbing element is a solar cell whereas the light emitting element is a light source such as an LED.

When the optomechanical system of the present invention is used with sunlight and solar cells, the present invention allows for a significant reduction in costs because the overall surface area of the solar cells can be significantly reduced with respect to systems which do not comprise the described optomechanical system of the present invention. Therefore, high efficiency solar cells can be used, increasing the efficiency of the system, without resulting in prohibitive costs. The optomechanical system ensures that incident sunlight is transmitted with high efficiency to the solar cells, whatever the angle of incidence of incident sunlight.

When the optomechanical system of the present invention is used with light emitting elements, for instance with LEDs, the present invention allows to capture the light emitted by the light emitting elements and to adjust the orientation and degree of convergence of the transmitted light.

In one preferred embodiment, the one or more guiding elements capable of limiting the degrees of freedom of the one or more translation elements are arranged in such a way that the relative position of the optical arrangement and the light absorption/emission substrate can be accurately adjusted by the shifting mechanism, and more specifically avoiding or minimizing relative rotations between the optical arrangement and the light absorbing/emitting substrate. This allows to have a shifting mechanism which ensures that the relative movement of the optical arrangement and the light absorbing/emitting substrate occurs only in translation, without rotation.

In one preferred embodiment, the optical arrangement is attached to the front side of the static frame element, forming together a closed box which surrounds completely the light absorbing/emitting substrate and the shifting mechanism, such that influences from environmental factors (such as mechanical shocks, wind load or humidity) are minimized.

In a further embodiment the optical arrangement incorporates a venting system to prevent excessive pressure to build up and/or water condensation to occur within the closed space defined by the static frame element and the optical arrangement when the external conditions are changing (e.g. temperature change). The lifetime and reliability of the system can thus be increased.

In another preferred embodiment of the present invention, the guiding element is attached between the static frame element and a first translation element, or between a first translation element and a second translation element. More particularly, the system further comprises a guiding module comprising a first guiding element, a second guiding element, a static attachment element, an intermediate translation element and a mobile attachment element, the guiding module is arranged such that the first guiding element is attached between the static attachment element that is bound to the static frame element, and the intermediate translation element; the second guiding element is arranged along an axis perpendicular to the first pair of guiding element and attached between the intermediate translation element and the mobile attachment element bound to the translation element. Thanks to the specific arrangements of the guiding elements described above, the guiding module is able to guide the translation element on two perpendicular axes.

In another preferred embodiment, at least one of the guiding elements is a flexible guiding element, e.g. a spring or leaf spring. Flexible guiding elements based on mechanical deformation are advantageous for mechanical systems requiring high reliability and long lifetime (such as the optomechanical system of the present invention), since they do not involve friction and do not suffer from wear. In addition, their rigidity in the direction perpendicular to the movement and their precision in carrying out small displacements qualify them particularly for this type of systems.

In another embodiment of the present invention, the optomechanical system further comprises one or more sliders arranged between the optical arrangement and the light absorbing/emitting substrate. The one or more slider can be fixed on either of its ends and sliding on the other, or it can be arranged to slide on both ends. For instance, the sliders can be fixed to the optical arrangement on one end and sliding on the light absorbing/emitting substrate on the other end, or vice-versa. A pre-constraining element, such as a spring, can be arranged on the same axis as the sliders, to ensure that the sliders are always in contact with the surface they are sliding on. With an appropriate number of sliders, the distance between the optical arrangement and the light absorbing/emitting substrate can be accurately and reliably preserved over the whole surface of the optomechanical system. Furthermore, the rigidity of the optomechanical system on the axis perpendicular to the surface of the optical arrangement is greatly increased, lowering the rigidity requirements on other guiding elements of the shifting mechanism.

In a further embodiment, some intermediate sliding pads can be arranged between the sliders and the surface they are sliding on, in order to reduce friction and/or to locally change the slope of the surface on which the sliding occurs. More specifically, the sliding pads can have any desired curvature (for instance a portion of sphere), in such a way that when the slider is moving laterally on the sliding pad, the distance between the optical arrangement and the light absorbing/emitting substrate is changing according to the desired curvature. Otherwise said, a lateral displacement induces a controlled vertical displacement. This configuration is advantageous to increase the efficiency and/or the angular acceptance of the optomechanical system.

In another preferred embodiment of the present invention, the optical arrangement is directly attached to the light absorbing/emitting substrate by means of guiding elements, such as double cardan joints or double ball joints, in such a way that the relative movement of the optical arrangement with reference to the light absorbing/emitting substrate is guided along a curved trajectory (for instance a portion of sphere). The direct mechanical link provided by these guiding elements ensures a more accurate positioning of the optical arrangement and the light absorbing/emitting substrate relative to each other. Additionally, a curved displacement trajectory can be advantageous to increase the efficiency and/or the angular acceptance of the optomechanical system.

In one further preferred embodiment, the optical arrangement comprises at least one optical layer, wherein the optical layer comprises one or a plurality of optical elements. However, two or more optical layers are possible. One optical layer of the optical arrangement is sufficient to alter the pathways of the incident light. Two or more optical layers can be advantageously combined to alter (concentrate, transmit, reflect) the light pathways such that higher flexibility and increased precision can be achieved. Each optical layer may comprise a plurality of optical elements such that the one or more optical layer can be suitably adjusted and optimized.

In another preferred embodiment of the present invention, the optical arrangement comprises at least two optical layers bonded to each other, either directly or by means of an adhesive layer. In this embodiment, the front optical layer (the one farthest from the light absorbing/emitting substrate) is made of a relatively rigid material, such as glass or acrylic (PMMA), to increase the rigidity of the optical arrangement and protect the subsequent optical layers from mechanical shocks or environmental pollution (such as dust or humidity). The front optical layer is typically flat (without optical elements), but it can be also patterned to alter the path or distribution of transmitted light. Furthermore, the front optical layer can be coated with a single- or double-sided anti-reflective coating to improve light transmission In a further embodiment, the optical elements are of reflective type such as mirrors or of refractive type such as lenses including plano-convex, plano-concave, bi-convex, bi-concave, meniscus type and aspheric curvature having polynomial shape. Optical elements such as lenses with aspheric curvature (polynomial shape), including one or more inflection points, allow for a higher design freedom to increase the angular acceptance and reduce optical aberrations.

In one further embodiment, the optical elements are coated with reflective coating such as metallization. Such optical elements could function as mirrors, for example.

In one most preferred embodiment, the light absorbing element is a solar cell and/or the light emitting element is a LED. The solar cells are configured to absorb or capture transmitted light while the LEDs are capable of emitting incident light. Typically, the optomechanical system of the present invention has a light absorbing/emitting substrate containing either light absorbing elements (i.e. solar cells) or light emitting elements (i.e. LEDs). Nevertheless, it is of course not excluded to have an embodiment in which the light absorbing/emitting substrate can also be made up of a mixture of light absorbing elements and light emitting elements.

In a further preferred embodiment, the shifting mechanism comprises at least one actuator and a control system, such that at least one optical layer of the optical arrangement or the light absorbing/emitting substrate can be moved in one or more degrees of freedom in a translational movement. The translational movement may be configured in one, two or three degrees of freedom accordingly. Higher degree of freedom in translation could increase the accuracy and sensitivity of the system, so that the absorption of light by the light absorbing elements (e.g. solar cells) or the emission of light by the light emitting elements (e.g. LEDs) can be optimized.

In another preferred embodiment of the present invention, the shifting mechanism comprises two or more actuators disposed in parallel to the same translational axis but at opposite ends of the translation element and one or more actuator disposed in a direction perpendicular to the first two. This configuration allows to cancel any parasitic rotation of the translation element around an axis normal to the optical arrangement, in order to ensure that there is no relative rotation between the light absorbing/emitting substrate and the optical arrangement.

According to one embodiment, the actuator is an electro-mechanical actuator, an electro-static actuator, a piezo-electrical actuator, a stick-slip actuator or a pneumatic actuator.

According to a further embodiment, the optomechanical system of the invention further comprises a feedback control loop to monitor the position of the translation element, wherein the feedback control loop is for example an optical sensor, a magnetic sensor or a photovoltaic sensor, or a combination of several of these sensors. The one or more sensors can report information on the relative or absolute position of the translation element, the optical arrangement, or the light absorbing/emitting substrate (or a combination thereof), such that the light absorption or the light emission can be optimized.

In another embodiment of the present invention, the static frame is at least partially open at the bottom and a flexible membrane seals the gap between the translation element and the static frame while allowing the translational element to move both laterally and vertically. In this configuration, the translation element and with it light absorbing/emitting substrate are directly exposed to ambient temperature which allows the heat to be dissipated by convection.

In a second aspect, the present invention relates to a method for absorbing light or emitting light with the aforementioned optomechanical system of the first aspect of the present invention, comprising the steps of capturing incident light and transmitting transmitted light,
absorbing transmitted light or emitting incident light,
moving at least one of the optical layer of the optical arrangement relative to the light absorbing/emitting substrate or vice versa, wherein the shifting mechanism moves the at least one optical layer of the optical arrangement or the light absorbing/emitting substrate translationally by means of one or more translation elements, in such a way that the transmitted light can be optimally absorbed by the light absorbing/emitting substrate, or that the incident light emitted by light absorbing/emitting substrate can be optimally transmitted by the optical arrangement.

In a third aspect, the present invention relates to a method for absorbing light or emitting light with the optomechanical system of the present invention, wherein a mechanical structure of the shifting mechanism is manufactured out of a single block of material by stamping, laser or water cutting, then folding into a final shape, and preferably including welding or soldering at one or more joints or points.

BRIEF DESCRIPTION OF THE DRAWINGS

The foregoing and other objects, features and advantages of the present invention are apparent from the following detailed description taken in combination with the accompanying drawings in which.

DETAILED DESCRIPTION OF THE PREFERRED EMBODIMENTS OF THE INVENTION

Figure 1:
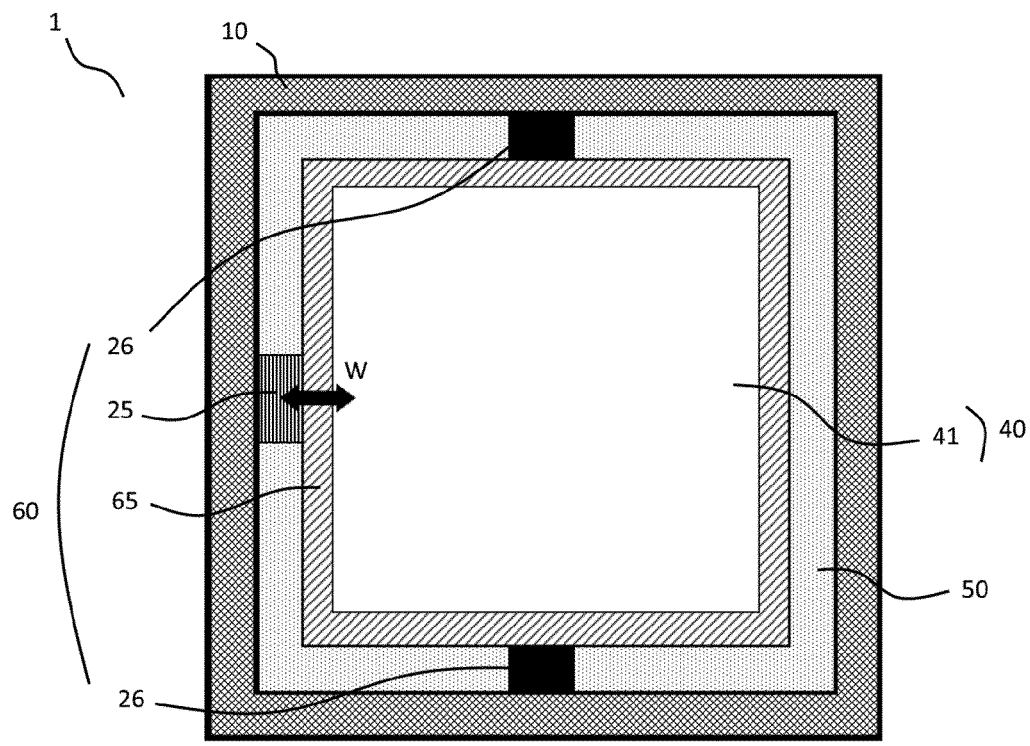
FIG. 1 is a schematic top view of an optomechanical system according to a first embodiment of the present invention.

FIG. 1 illustrates a schematic top view of an optomechanical system 1 according to a first embodiment of the present invention. This optomechanical system 1 comprises an optical arrangement 40, a light absorbing/emitting substrate 50 and a shifting mechanism 60.

As can be seen in the FIG. 1, in this embodiment the shifting mechanism 60 comprises a translation element 65, one actuator 25 and two guiding elements 26. The optical arrangement 40, comprising in this embodiment only a first optical layer 41, is mounted on the translation element 65, while the light absorbing/emitting substrate 50 is fixed to the static frame 10. Thanks to the shifting mechanism 60, the translation element 65 can only move in translation along the direction W. In other words, the shifting mechanism 60 is arranged to move the translation element 65 translationally with one degree of freedom.

The static frame element 10 is an outer frame of the optomechanical system 1. In some embodiments, it is preferable that the static frame element 10 surrounds entirely the optical arrangement 40, the light absorbing/emitting substrate 50 and the shifting mechanism 60. The frame element 10 can be made of metal material such as aluminium, steel or stainless steel. The outer frame can be mounted on areas such as commercial or residential rooftops, or in the ceiling of rooms such as museums exhibition spaces, office spaces or meeting rooms.

Figure 2:
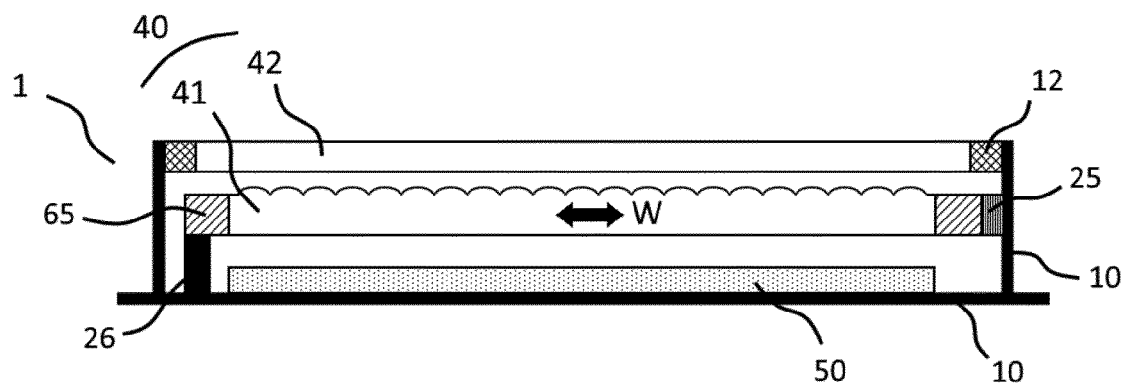
FIG. 2 is a schematic cross-sectional view of an optomechanical system according to a second embodiment of the present invention where the optical arrangement comprises one movable optical layer and one static optical layer.

FIG. 2 shows the optomechanical system 1 according to a second embodiment of the present invention. In this embodiment, the components 50 and 60 are encapsulated within a box formed by the static frame element 10 and the optical arrangement 40. The optomechanical system 1 comprises an optical arrangement 40 with two optical layers 41 and 42. In this second embodiment, the second optical layer 42 and the light absorbing/emitting substrate 50 are attached to the static frame element 10. The attachment of the second optical layer 42 may be done through one or more joint 12. In this embodiment, the second optical layer 42 and the light absorbing/emitting substrate 50 are not movable. The first optical layer 41 of the optical arrangement 40 is mounted on the translation element 65. Thanks to the translation element 65, the first optical layer 41 can be moved translationally in the direction of W through the actuation of the actuator 25. A guiding element 26 restricts the degrees of freedom of the translation element 65, so that it can only move in translation in the direction of W.

Figure 3A:
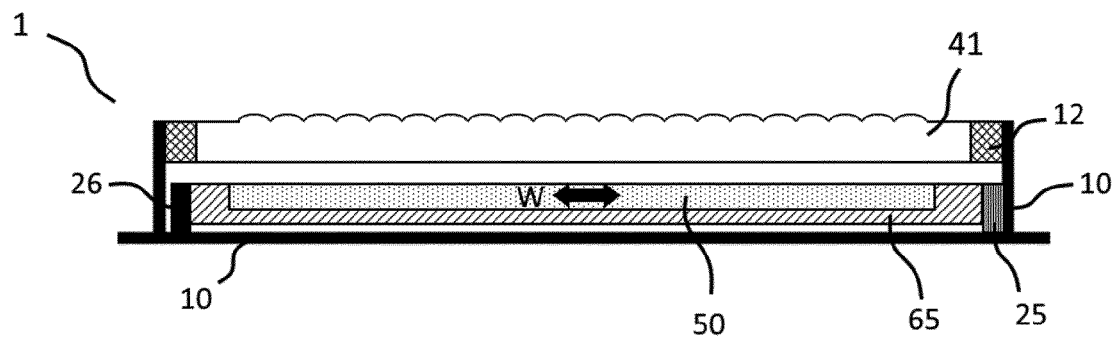
FIG. 3A is a schematic cross-sectional view of an optomechanical system according to a third embodiment of the present invention where the optical arrangement comprises only one static optical layer and the light absorbing/emitting substrate is movable.
Figure 3B:
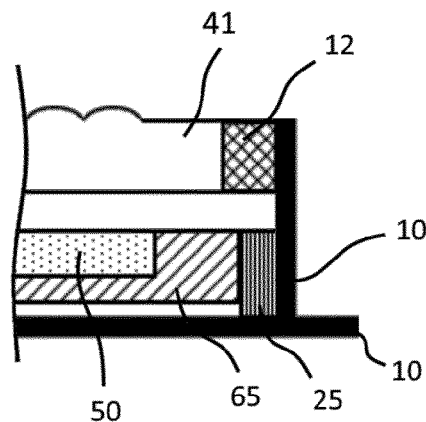
FIGS. 3B and 3C are schematic cross-sectional views of the shifting mechanism of an optomechanical system according to the third embodiment of the present invention (corresponding to FIG. 3A)
Figure 3C:
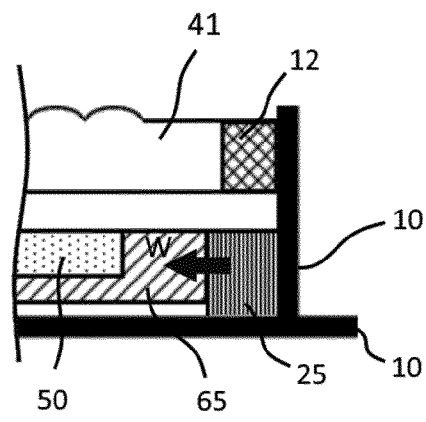

FIGS. 3A to 3C illustrate the optomechanical system 1 according to a third embodiment of the present invention. In this embodiment, the optical arrangement 40 comprises only the first optical layer 41, which is not movable due to its attachment to the static frame element 10 through one or more joints 12. The light absorbing/emitting substrate 50 is mounted on a translation element 65. The translation element 65 of the shifting mechanism 60 is actuated by one actuator 25 and guided by a guiding element 26. FIGS. 3B and 3C are two detailed views from the schematic cross-sectional view of FIG. 3A. As can be seen in the detailed views, thanks to the actuator 25 and the guiding element 26, the translation element 65 is moved translationally in a linear direction W.

Figure 4A:
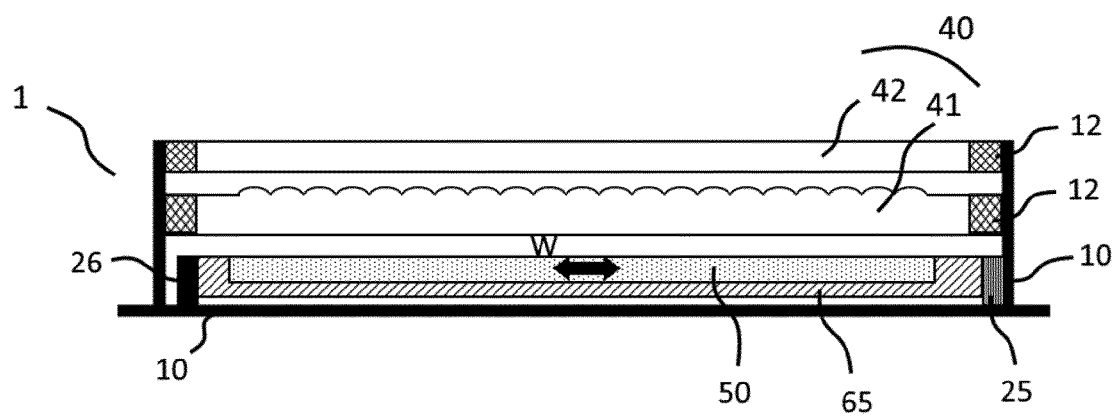
FIG. 4A is a schematic cross-sectional view of an optomechanical system according to a fourth embodiment of the present invention where the light absorbing/emitting substrate is movable and the optical arrangement comprises two static optical layers.

FIG. 4A illustrates a fourth embodiment of the present invention. This embodiment is similar to the embodiment of the FIG. 3A, except that the optical arrangement 40 is composed of two optical layers 41 and 42. In this embodiment, both layers of the optical arrangement 40 are attached to the static frame element 10 through one or more joints 12, and hence are not movable. The light absorbing/emitting substrate 50 is attached to the translation element 65. Thanks to the actuator 25 and the guiding element 26, the light absorbing/emitting substrate 50 mounted on the translation element 65 can be moved translationally in the direction of W, as depicted in the FIG. 3C.

The second optical layer 42 of the optical arrangement 40 has good optical properties, thus allowing for high light transmission, and good mechanical properties, to protect the optomechanical system from mechanical shocks or environmental pollution. For instance, optical layer 42 can be made of glass, PMMA (acrylic) or polycarbonate (PC). Of course, other suitable materials can also be used to manufacture this optical layer.

Flexible expansion joints 12 can be used to connect the optical layers 41 and 42 of the optical arrangement 40 to the static frame element 10, in order to accommodate thermal expansion coefficients mismatches between the optical layers and the static frame element 10.

The optomechanical system 1 of the present invention may comprise a venting system (not shown here), composed of one or more pressure equalization membranes, and incorporated into the static frame element 10. The pressure equalization membranes can be made of rubber or Gore-Tex® material for example. The advantage of a venting system is to regulate the pressure and humidity of the air enclosed within the static frame element 10, in order to ensure that the optomechanical system of the present invention can function in the most efficient manner.

To this end, it is noted that in all embodiments of the present invention, the optical arrangement 40 of the optomechanical system 1 is capable of capturing both externally- and internally-generated incident light 80 and transmitting transmitted light 90 optimally thanks to the shifting mechanism 60 of the present invention. In other words, each embodiment can be used to either capture or absorb externally generated incident light or to emit internally generated light.

Figure 4B:
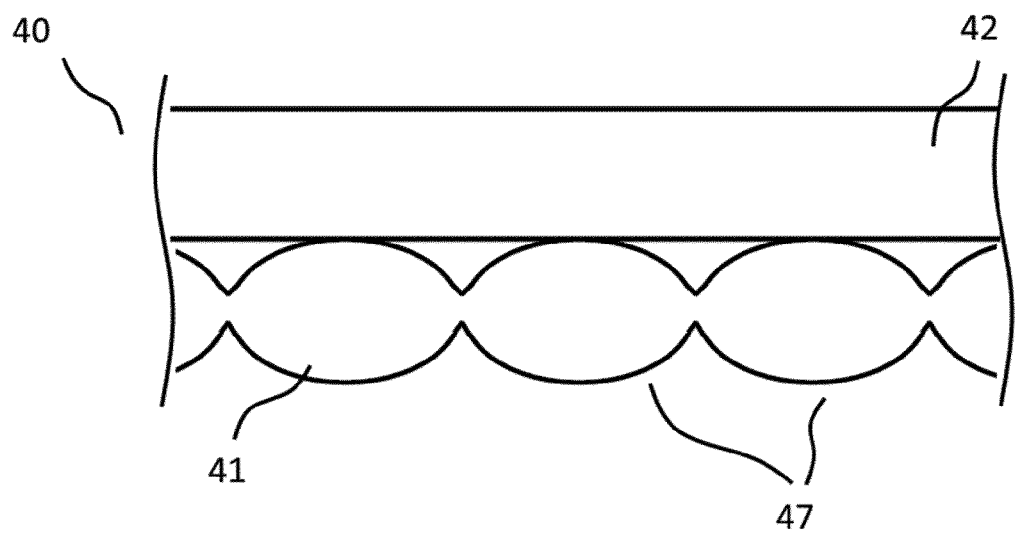
FIG. 4B is a detailed schematic cross-sectional view of the optical arrangement according to a fifth embodiment where the optical arrangement is composed of two optical layers bonded together directly.
Figure 4C:
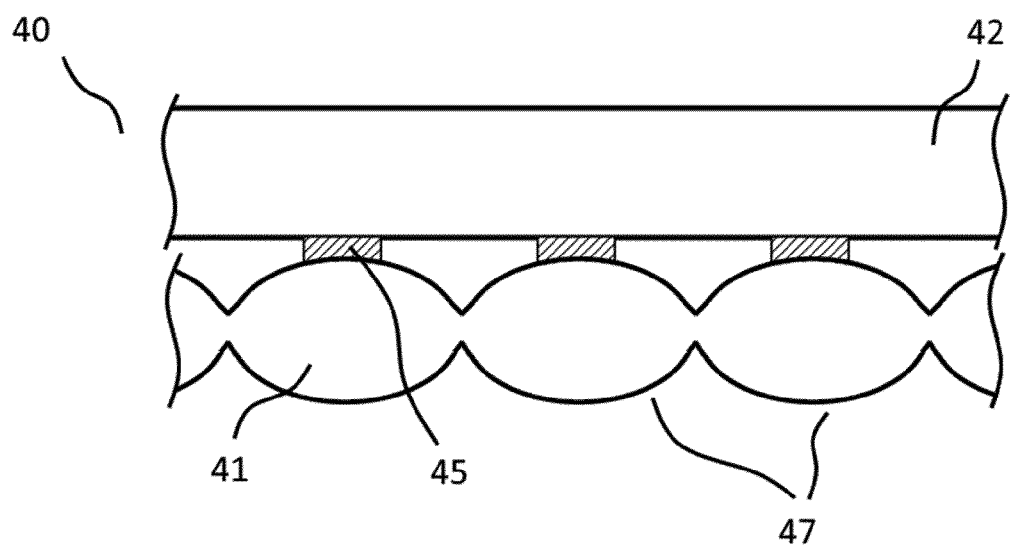
FIG. 4C is a detailed schematic cross-sectional view of the optical arrangement according to a sixth embodiment where the optical arrangement is composed of two optical layers bonded together by means of an adhesive layer.

FIGS. 4B and 4C illustrate a fifth and a sixth embodiment of the present invention where the optical arrangement 40 is composed of two optical layers 41 and 42 attached together. In FIG. 4B, the two optical layers are directly bonded together, for instance by injection moulding, or using a plasma activation process. The two optical layers can also be bonded together by means of an intermediate adhesive layer 45, as for example silicone glue or UV cured glue, as depicted in FIG. 4C.

Figure 4D:
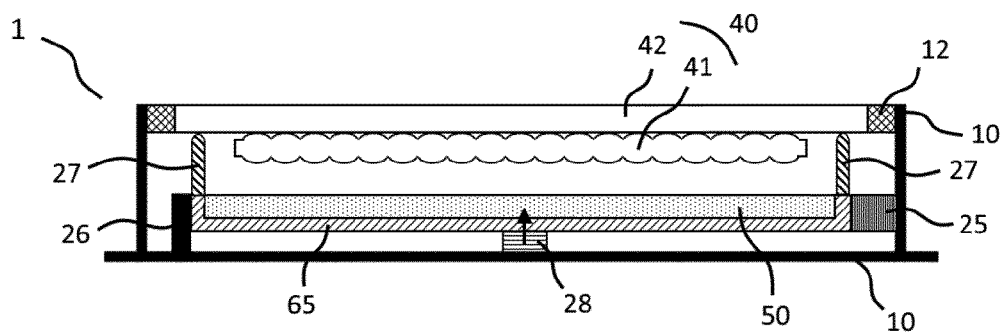
FIG. 4D is a schematic cross-sectional view of an optomechanical system according to a seventh embodiment of the present invention with a movable light absorbing/emitting substrate and with sliders and a pre-constraining element to maintain a constant distance between the light absorbing/emitting substrate and the optical arrangement.
Figure 4E:
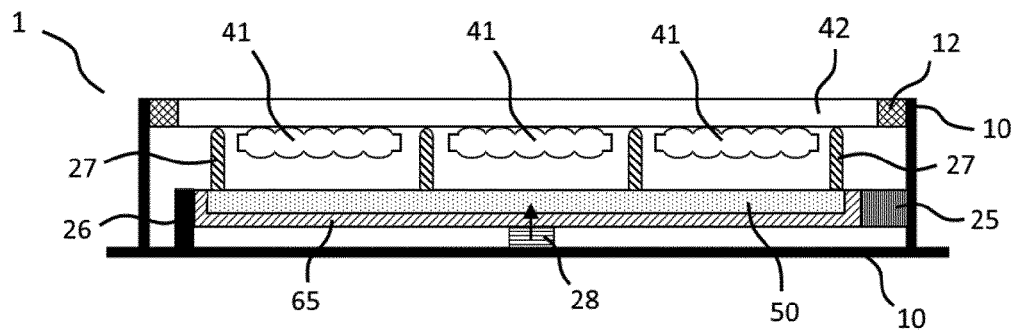
FIG. 4E is a schematic cross-sectional view of an optomechanical system according to the same embodiment as FIG. 4D, but where the first optical layer is composed of several blocks in order to be able increase the number of sliders.

Thanks to the direct bonding of the two optical layers 41 and 42, it is possible, according to a seventh embodiment of the present invention, to implement a plurality of sliders 27 that ensure, in combination with one or a plurality of pre-constraining elements 28 that the distance between the substrate 50 and the optical arrangement 40 is constant over the whole optomechanical system, as shown in FIG. 4D. The pre-constraining elements can for instance be springs or leaf springs. The number of sliders is typically at least three in the direction of movement of the actuator 25 and increases with the size/surface of the panel. In order to accommodate a plurality of sliders, the first optical layer 41 of the optical arrangement 40 can be made of several blocks as illustrated in FIG. 4E.

Figure 4F:
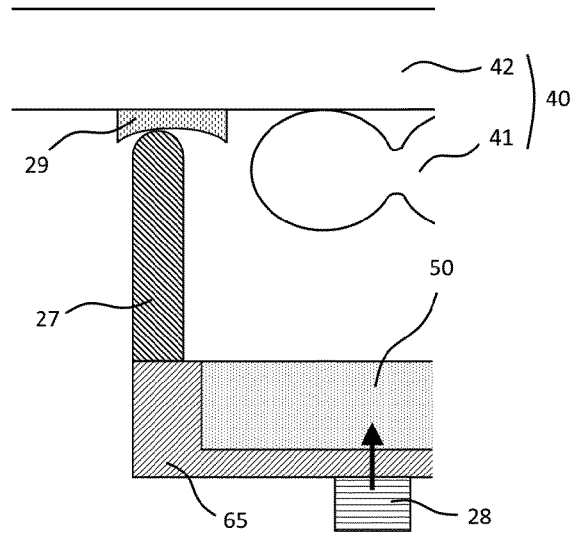
FIG. 4F is a detailed schematic cross-sectional view of the optomechanical system according to an eighth embodiment where sliding pads are arranged between the sliders and the optical arrangement.

The sliders 27 can slide directly on the surface of one of the layers of the optical arrangement 40, if necessary with the addition of a coating to reduce friction, or according to an eighth embodiment of the present invention they can slide on flat or curved sliding pads 29, as shown in FIG. 4F. The curvature of the sliding pads 29 can be used to change the distance between the light absorbing/emitting substrate 50 and the optical arrangement 40 when the translation element 65 is moving laterally.

Figure 4G:
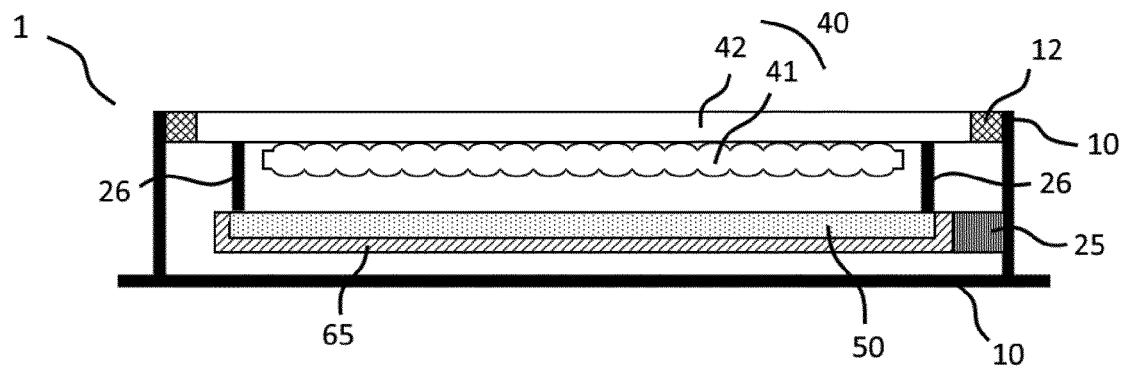
FIG. 4G is a schematic cross-sectional view of an optomechanical system according to a ninth embodiment of the present invention with a movable light absorbing/emitting substrate, attached directly to the optical arrangement by means of guiding elements.
Figure 4H:
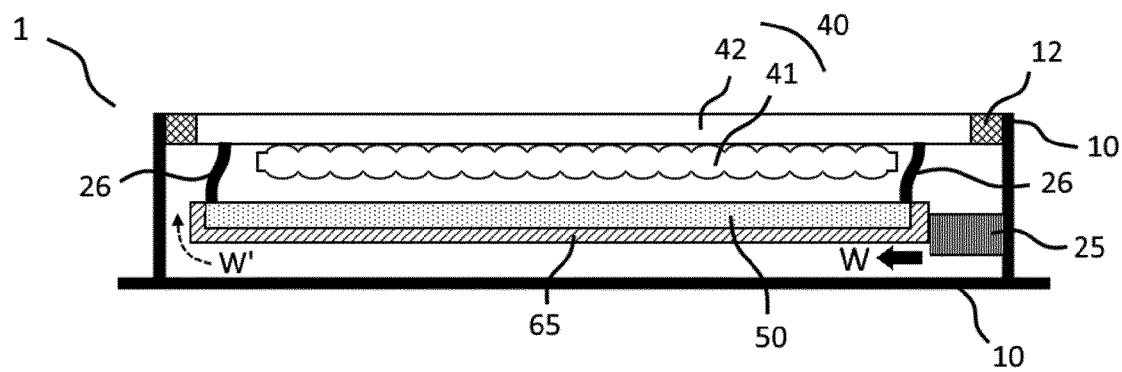
FIG. 4H represents the same embodiment as FIG. 4G but where the movable light absorbing/emitting substrate, attached directly to the optical arrangement by means of guiding elements, has been shifted by the shifting mechanism.

According to a ninth embodiment of the present invention, the light absorbing/emitting substrate 50 is directly attached to the optical arrangement 40 by means of guiding elements 26, as shown in FIG. 4G. In this case, the guiding elements 26 can be flexible guiding elements such as leaf springs, or any suitable type of flexible elements such as double ball joints, double magnetic ball joints or double universal joints (double cardan joints). As illustrated in FIG. 4H, the guiding elements are designed in such a way that when the linear actuator 25 pushes or pulls the translation element 65 in the direction W, the light absorbing/emitting substrate 50, mounted on the translation element 65, moves along a curved trajectory W', for instance a portion of a circle. In other words, the guiding elements 26 transform the linear movement of the actuator 25 into a circular movement of the translation element 65.

Figure 4I:
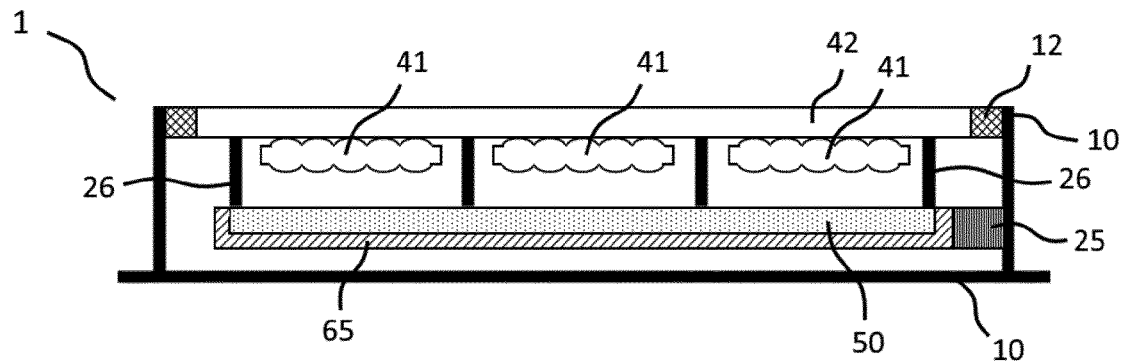
FIG. 4I represents the same embodiment as FIG. 4G but with a plurality of guiding elements and an optical layer composed of several blocks.

Similarly, to the embodiment with the sliders 27, a plurality of flexible guiding elements 26 can be implemented in the present embodiment as illustrated in FIG. 4I. In order to accommodate a plurality of flexible guiding elements, the first optical layer 41 of the optical arrangement 40 is made of several blocks.

Figure 4J:
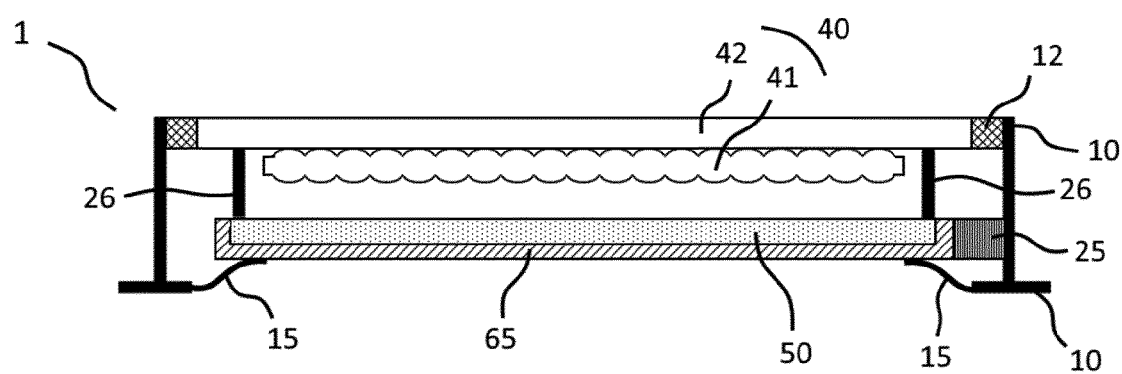
FIG. 4J is a schematic cross-sectional view of an optomechanical system according to a tenth embodiment of the present invention with a partially opened static frame at the bottom.

According to a tenth embodiment, illustrated in FIG. 4J, the static frame 10 is at least partially open at the bottom and replaced by a flexible membrane 15. In this embodiment, the translation element 65 (and with it the light absorbing/emitting substrate 50) are directly exposed to ambient temperature and heat can therefore be dissipated by convection. The flexible membrane 15 seals the gaps between the translation element 65 and the static frame 10, while allowing the translation element 65 to move both laterally and vertically.

Figure 5A:
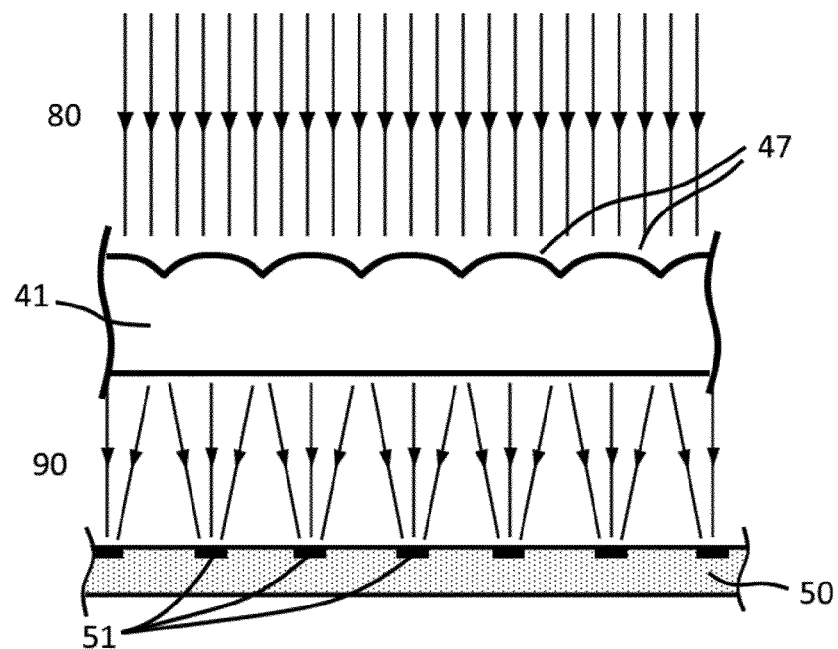
FIGS. 5A and 5B are schematic cross-sectional view of an optomechanical system according to an eleventh embodiment of the present invention with externally-generated incident light.
Figure 5B:
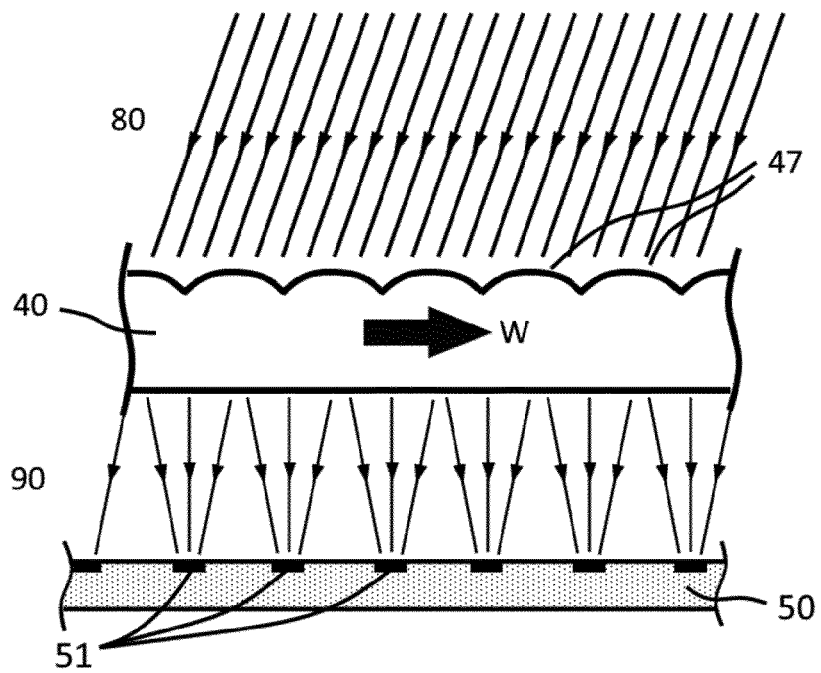

FIGS. 5A and 5B are schematic cross-sectional views according to an eleventh embodiment of the present invention, whereby the light absorbing/emitting substrate 50 is capable of absorbing transmitted light. Externally-generated incident light 80 such as sunlight coming from different directions impacts on the optical arrangement 40. The optical arrangement may contain one or more optical layers. Thanks to the optical arrangement 40, externally-generated incident light 80 is captured and the transmitted light 90 is then concentrated onto the plurality of light absorbing elements 51 of the light absorbing/emitting substrate 50. In this application, the term "concentrate" basically means that a beam of light is focused on a specific point.

Figure 5C:
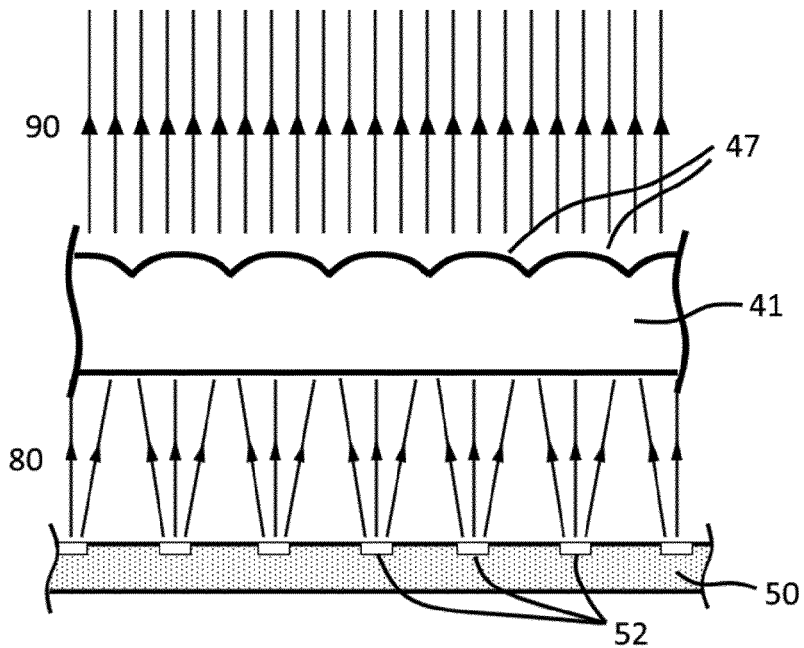
FIGS. 5C and 5D are schematic cross-sectional view of an optomechanical system according to a twelfth embodiment of the present invention with internally-generated incident light.
Figure 5D:
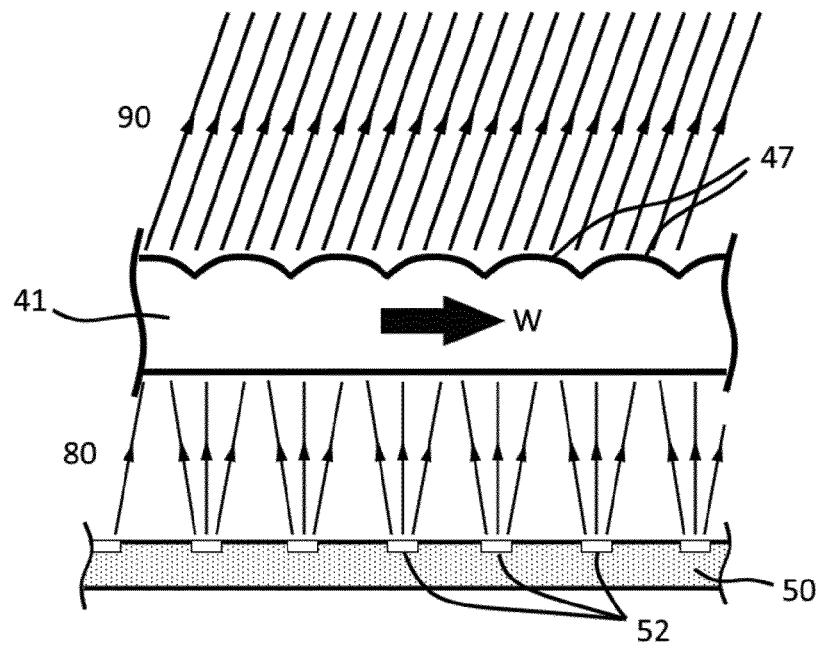

FIGS. 5C and 5D are schematic cross-sectional views according to a twelfth embodiment of the present invention, whereby the light absorbing/emitting substrate 50 is capable of emitting incident light 80. In this embodiment, the light emitting substrate 50 emits incident light towards the optical arrangement 40. The optical arrangement 40 then alters the path of the incident light 80, to output a transmitted light 90 with a controlled orientation and degree of convergence. To this end, the light output can be adjusted dynamically to achieve the desired illumination.

In this invention, it has been found out that an advantageous solution would be arranging an optical arrangement 40 above an LED panel such that the incident light from each individual light emitting element can be captured and transmitted, thereby controlling the orientation and degree of convergence of the luminaire output. The advantage of such configuration would be that the light output of the luminaire can be oriented by short translational movements within the luminaire casing, removing the need to rotate or tilt the luminaire itself.

In all of the aforementioned embodiments, the light absorbing/emitting substrate 50 is capable of absorbing transmitted light 90 from the optical arrangement 40, or the light absorbing/emitting substrate 50 is capable of emitting incident light 80 towards the optical arrangement 40. The shifting mechanism 60 can be arranged according to several different configurations, for example as shown in FIGS. 6 to 11. In all these configurations, the shifting mechanism 60 is capable of moving the optical arrangement 40 with at least one degree of freedom in translation relative to the light absorbing/emitting substrate 50, or vice versa. To that end, the shifting mechanism 60 is arranged to move the optical arrangement 40 or the light absorbing/emitting substrate 50 translationally relative to the static frame element 10 (see arrowheads), through one or more translation element 65, actuator 25 and guiding element 26, in such a way that the transmitted light 90 is concentrated and can be optimally absorbed by the light absorbing/emitting substrate 50, or that the incident light 80 emitted by the light absorbing/emitting substrate 50 can be optimally transmitted by the optical arrangement 40.

For example, when the light absorbing/emitting substrate 50 comprises a plurality of light absorbing elements 51 such as solar cells, transmitted light 90 can be captured, concentrated and transmitted in an optimal way through the optical arrangement 40 to be absorbed by the light absorbing elements 51. On the other hand, when the light absorbing/emitting substrate 50 comprises a plurality of light emitting elements 52 such as LEDs, the incident light 80 emitted by the light emitting elements 52 can be re-oriented and re-shaped by the optical arrangement 40 to provide a transmitted light 90 with optimal orientation and shape.

Each optical layer of the optical arrangement 40 may comprise a plurality of optical elements 47. The optical elements can be for example lenses or mirrors. The optical elements can be made of glass, PMMA (acrylic), PC, silicone, or any other transparent or translucent materials. The optical elements can also be prisms with reflective coating such as metallization. The reflective coating can be applied by chemical process. The reflective coating can be made of a sheet of material bonded or glued to the optical element. Alternatively, the optical elements can be coated with anti-reflective coating to improve optical transmission.

Figure 6A:
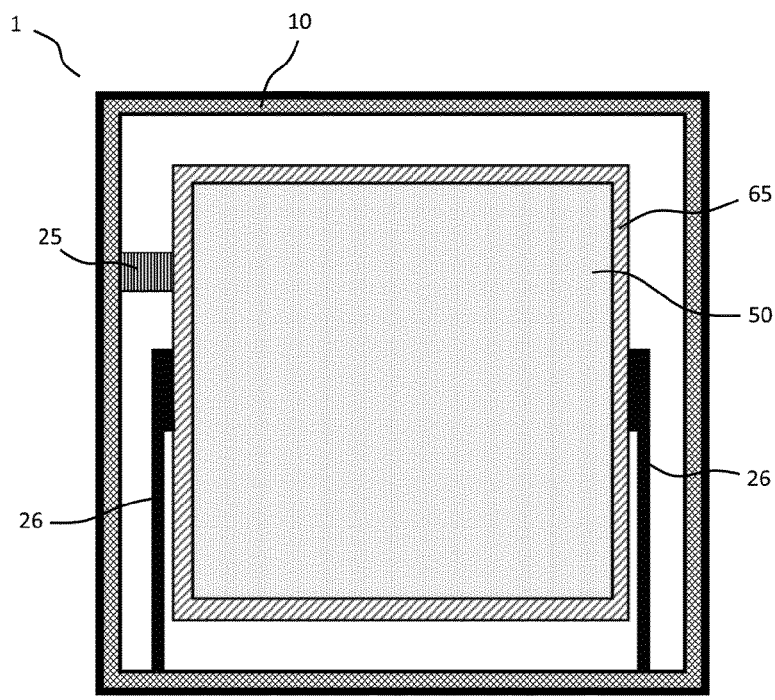
FIGS. 6A and 6B are schematic top views of an optomechanical system according to a thirteenth embodiment of the present invention.
Figure 6B:
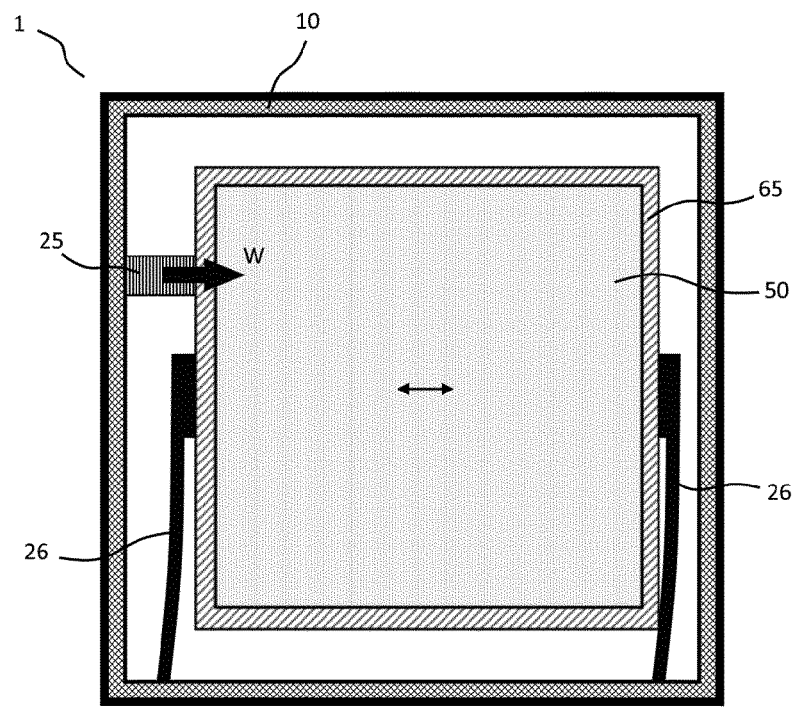

FIG. 6A is a schematic top view according to a thirteenth embodiment of the present invention. The shifting mechanism 60 comprises one actuator 25 and two flexible guiding elements 26. The actuator 25 is attached to the static frame element 10 at one side, and to the translation element 65 at another side. As can be seen in this figure, both flexible guiding elements 26 are connected to the translation element 65. When the actuator 25 is activated, the translation element 65 moves translationally in a single axis to the direction of W, as shown in FIG. 6B. In this embodiment, the translation element 65 moves with one degree of freedom.

The actuator 25, in all the presented embodiments, controlled by a control system may be for example an electro-mechanical actuator (such as a stepper motor, a DC motor, a brushless DC motor), an electro-static actuator, a piezo-electrical actuator, a stick-slip actuator, a pneumatic actuator. The control system may be based on a micro-controller or a micro-processor. A feedback control loop may further be introduced in the optomechanical system 1 of the present invention such that the position of the translation element 65 may be detected through for example an optical sensor, a magnetic sensor such as an encoder or a photovoltaic sensor such as solar cells.

FIG. 6B shows when the translation element 65 is moved by the actuator 25 in the direction of W, the two flexible guiding elements 26 function to limit the degree(s) of freedom of the translation element 65. The flexible guiding element 26 may for example be springs or leaf springs. One guiding element 26 may be sufficient to assert its effect, although more than one would be preferable, as they could control and limit the movement of the translation element 65 more accurately. Leaf springs are particularly well-suited for long and large structures moved along short strokes. Given that such a guiding system is based on mechanical deformation, fatigue would be the only failure mechanism. In other words, the guiding element 26 is able to sustain many cycles as long as the displacement involves a deformation within the elastic regime of the material. Moreover, since there is no friction or wear, the guiding element of the guiding mechanism does not require lubrication or maintenance.

Figure 6C:
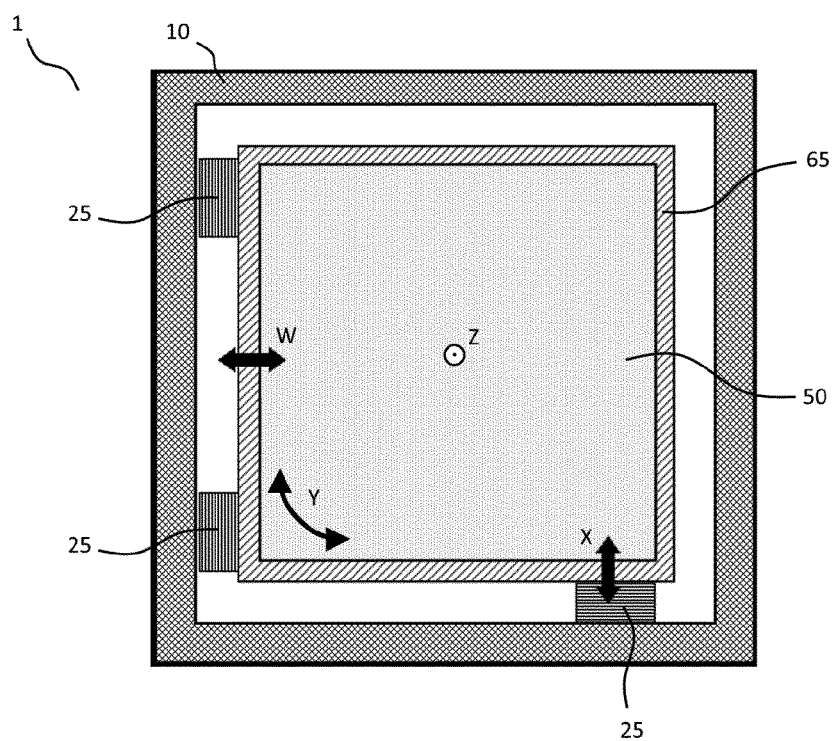
FIG. 6C is a schematic top view of an optomechanical system according to a fourteenth embodiment of the present invention.

FIG. 6C illustrates that, according to a fourteenth embodiment of the present invention, the shifting mechanism comprises three actuators 25, two of which are disposed in parallel on the same axis (W) but at opposite ends of the translation element 65, and a third one in a direction normal to the first two. This configuration permits to control and cancel any parasitic rotation Y of the translation element 65 around the axis Z.

Figure 7A:
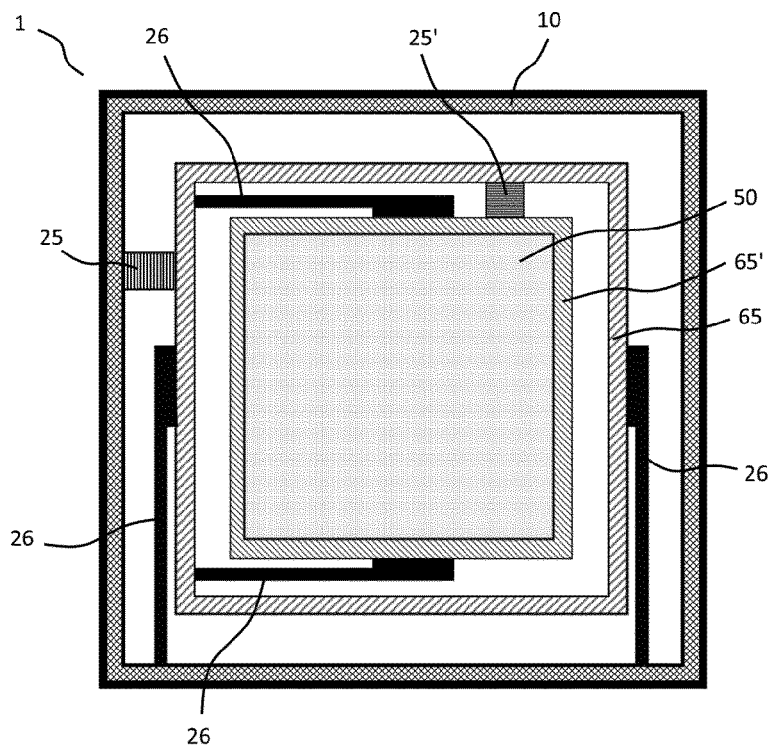
FIGS. 7A and 7B are schematic top views of an optomechanical system according to a fifteenth embodiment of the present invention.
Figure 7B:
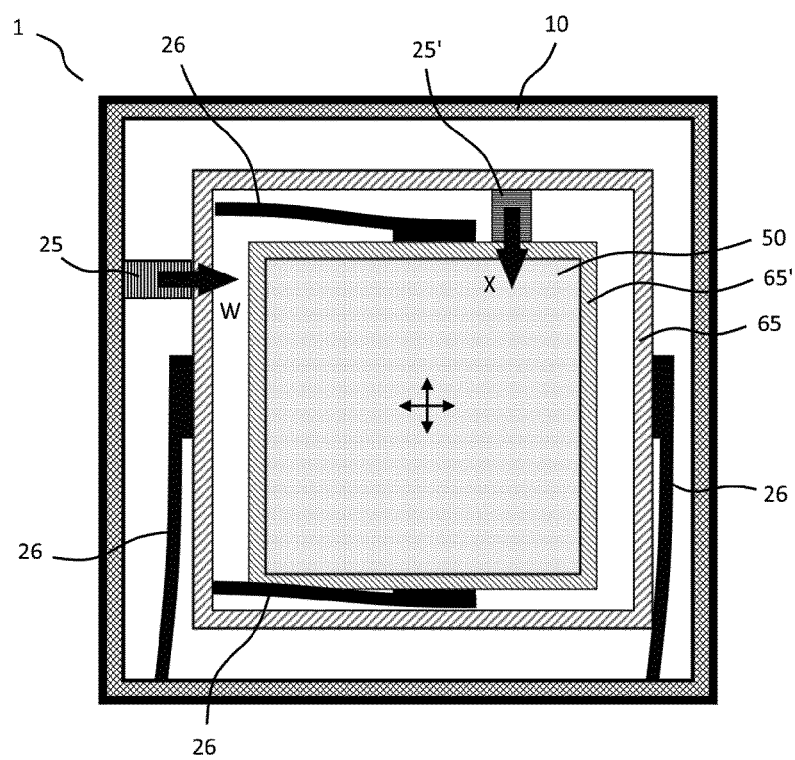

FIG. 7A shows another configuration of the present invention. According to this fifteenth embodiment, two actuators 25 are arranged in a perpendicular manner, such that the inner most translation element 65' can be moved in the direction of W and X, as shown in the FIG. 7B. The first actuator 25 is connected between a static frame element 10 and the outer most translation element 65. The second actuator 25' is connected between the outer most translation element 65 and the inner most translation element 65'. In this embodiment, the translation element 65 is capable of moving with one degree of freedom relative to the static frame element 10, and the translation element 65' is capable of moving in another degree of freedom relative to translation element 65, so that the translation element 65' is capable of moving with two degrees of freedom relative to the static frame element 10. Four guiding elements 26 can be seen in this eighth embodiment functioning together as two pairs to limit the degrees of freedom of the translation elements 65 and 65'.

Figure 8:
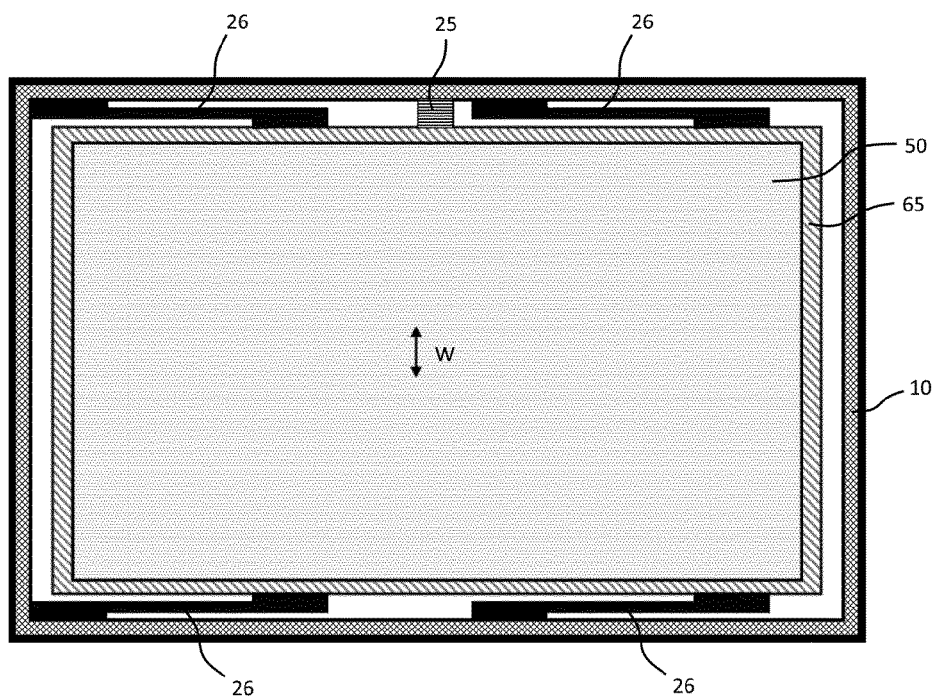
FIG. 8 is a schematic top view of an optomechanical system according to a sixteenth embodiment of the present invention.

FIG. 8 illustrates another possible configuration of the present invention. According to this sixteenth embodiment, the actuator 25 is arranged in between the static frame element 10 and the translation element 65. The actuator 25 is flanked by two guiding elements 26 on each side. Two further guiding elements 26 are arranged in an opposite location such that two pairs of guiding elements 26 function together to limit the degree of freedom of the translation element 65. This type of configuration is particularly suitable for optomechanical system having a larger set-up.

Figure 9:
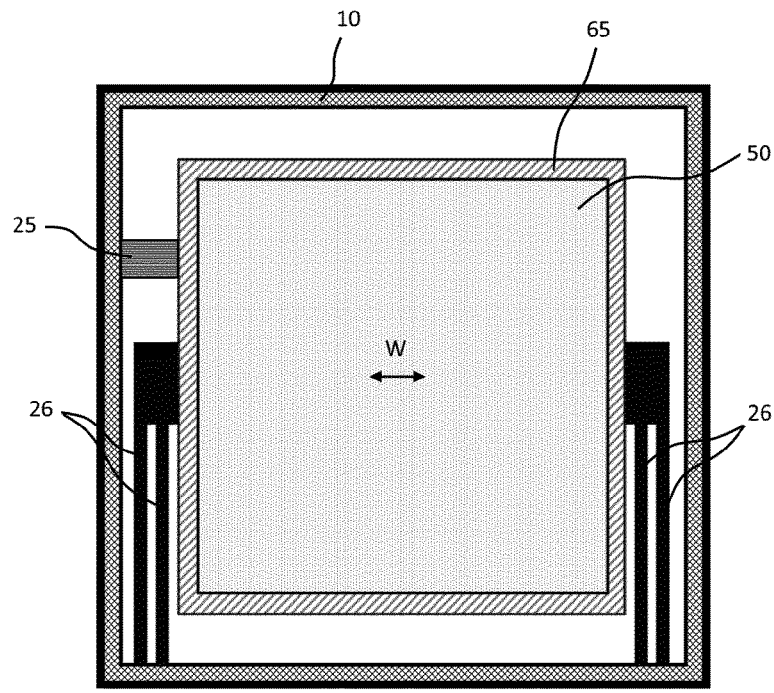
FIG. 9 is a schematic top view of an optomechanical system according to a seventeenth embodiment of the present invention.

FIG. 9 illustrates an optomechanical system 1 according to a seventeenth embodiment of the present invention. An actuator 25 is arranged at one side of the static frame element 10 such that the translation element 65 can be moved in the direction of W. A pair of guiding elements 26 having two elongated leaves can be seen in this embodiment. The guiding element 26 is attached between the static frame element 10 and the translation element 65.

Figure 10:
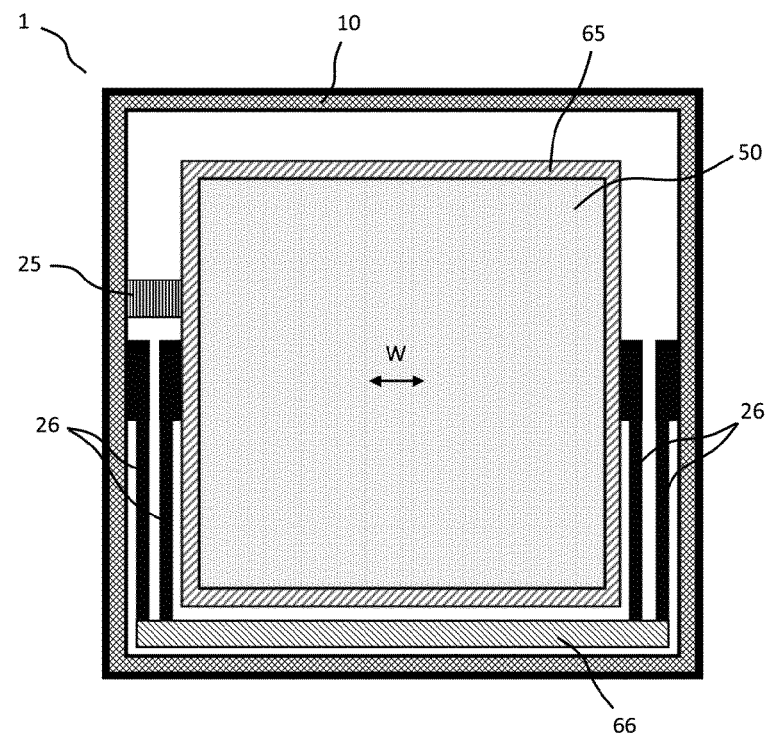
FIG. 10 is a schematic top view of an optomechanical system according to an eighteenth embodiment of the present invention.

FIG. 10 illustrates another possible configuration of the optomechanical system 1 according to an eighteenth embodiment of the present invention. Similar to the configuration of FIG. 9, an actuator 25 and a pair of guiding elements 26 having two elongated leaves can be seen. However, the ends of the elongated leaves are connected to an intermediate translation element 66 instead of the static frame element 10. This type of configuration improves the guiding accuracy and decreases the lateral forces applied to the actuator 25.

Figure 11A:
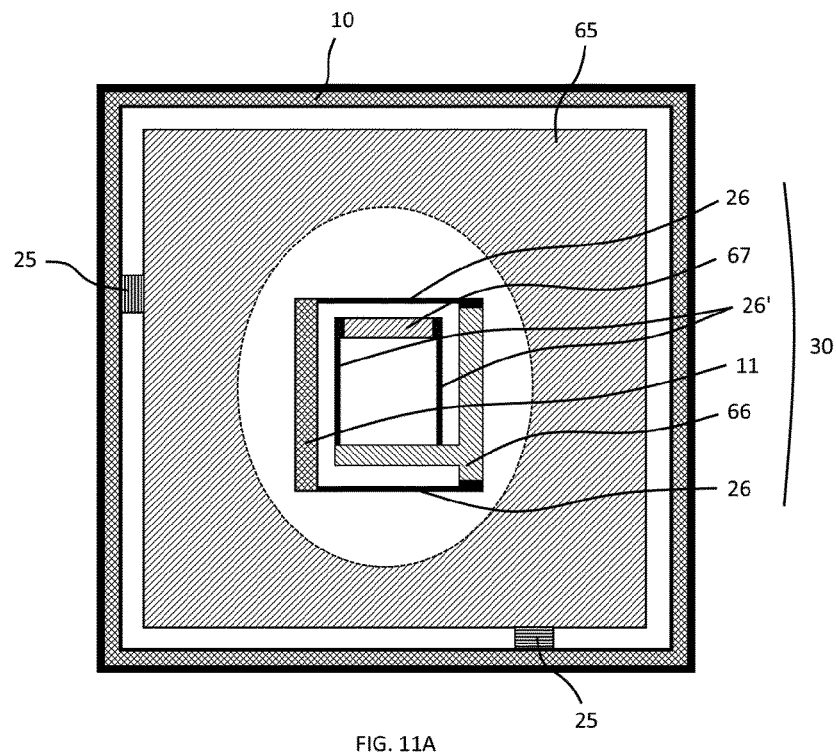
FIGS. 11A, 11B and 11C are schematic top views of an optomechanical system according to a nineteenth embodiment of the present invention.
Figure 11B:
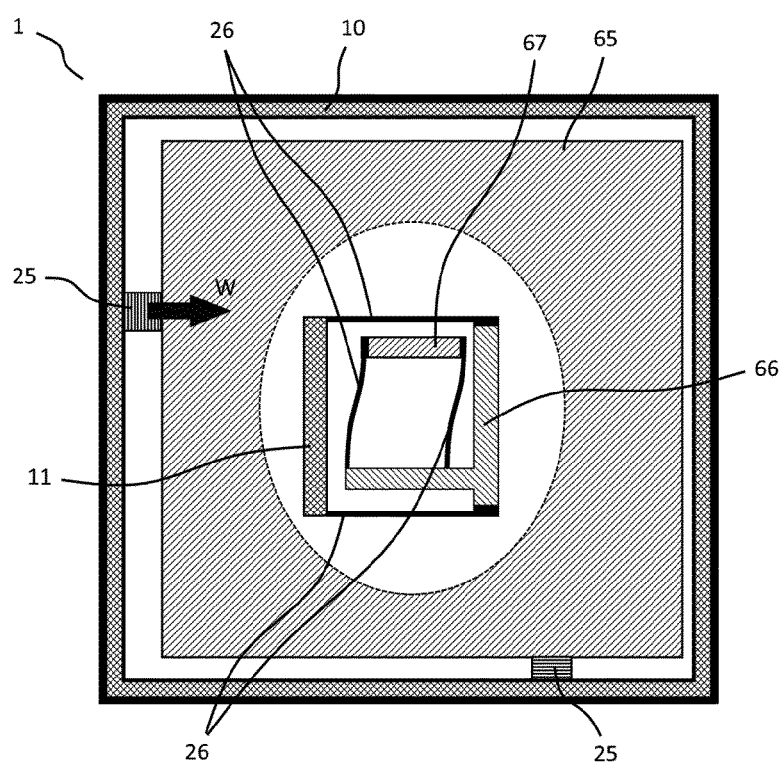
Figure 11C:
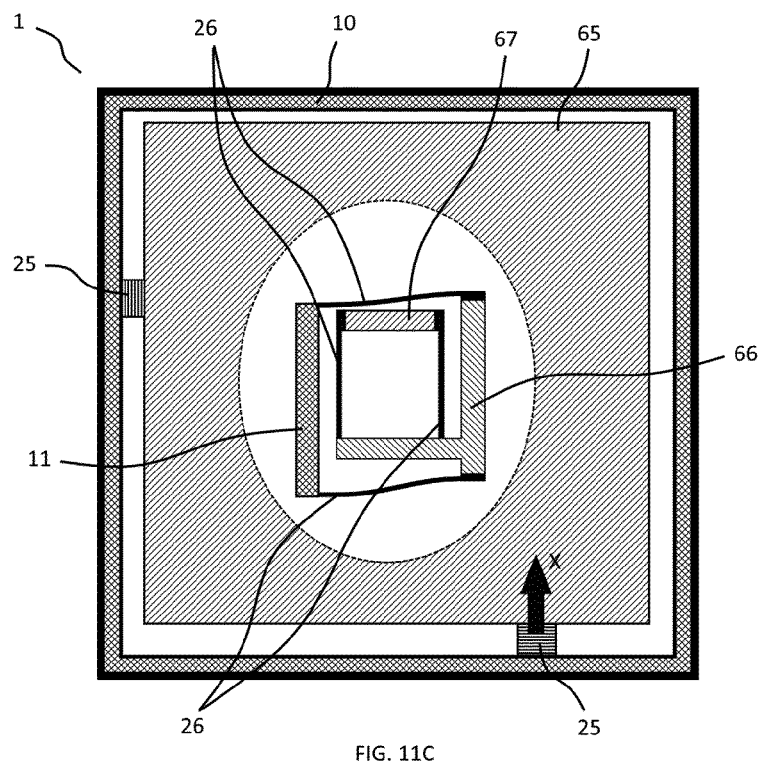

FIG. 11A illustrates another possible configuration of the optomechanical system 1 according to a nineteenth embodiment of the present invention. On this illustration, the optical arrangement 40 and the light absorbing/emitting substrate 50 have been removed for clarity. The dashed line denotes a cut through the translation element 65 to show some elements of the shifting mechanism 60 that are located underneath. According to this embodiment, a first pair of flexible guiding element 26 is attached between a static attachment element 11 that is bound to the static frame element 10, and an intermediate translation element 66. A second pair of flexible guiding element 26' is arranged along an axis perpendicular to the first pair of guiding element 26 and attached between the intermediate translation element 66 and a mobile attachment element 67 bound to the translation element 65. The two pairs of flexible guiding elements 26 and 26', along with the static attachment element 11, the intermediate translation element 66 and the mobile attachment element 67 form a flexible guiding module 30. As illustrated on FIGS. 11B and 11C, when the actuators 25 are actuated the translation element 65 moves along the axes W and/or X. Since the translation element 65 is attached to the mobile attachment element 67 of the guiding module 30, its movement is guided by the guiding elements 26 and 26' (through the intermediate translation element 66). The main advantage of such an embodiment is that the flexible guiding elements 26 and 26' can be made much smaller (shorter) than the translation element 65, ensuring a higher rigidity of the shifting system 60 with the same thickness. Additionally, the guiding module 30 can be cost-effectively machined out of a single block of material (e.g. by CNC machining), thus reducing the number of parts and steps required to assemble the optomechanical system 1, and increasing its accuracy and reliability.

Figure 12:
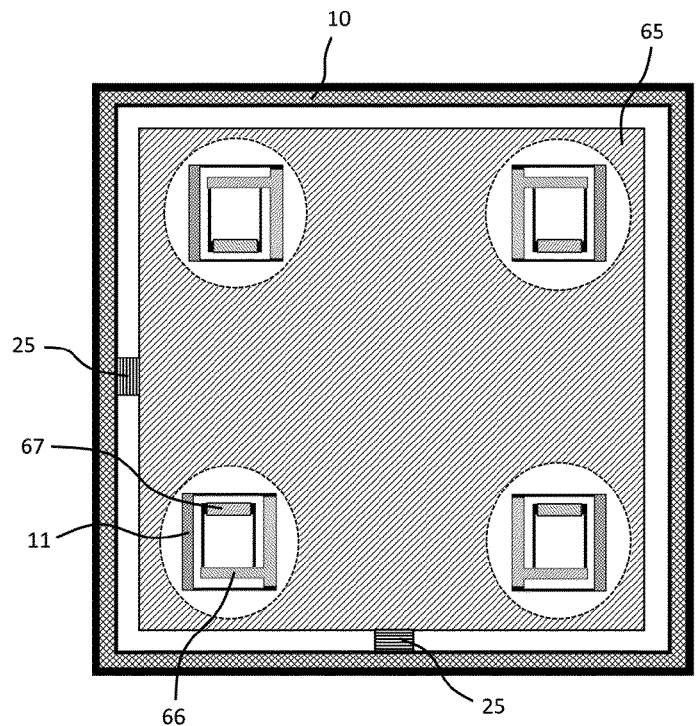
FIG. 12 is a schematic top view of an optomechanical system according to a twentieth embodiment of the present invention.

FIG. 12 illustrates a twentieth embodiment of the present invention where four guiding modules 30 are arranged underneath the translation element 65 and attached to it. Similarly to FIGS. 11A to 11C, when the actuators 25 are actuated, the displacement of the translation element is guided by the four guiding modules. In this Figure, four guiding modules are disposed in a symmetrical manner, but there could be more or less guiding modules, disposed according to different patterns. Such an embodiment ensures a better planarity and rigidity of the shifting mechanism 60.

It goes without saying that the shifting mechanism 60 as shown in all embodiments of the present invention is capable of moving either one of the optical layers 41 or 42 of the optical arrangement 40 or the light absorbing/emitting substrate 50 translationally in one, two or three degrees of freedom relative to the static frame element 10, thereby enabling the light absorbing/emitting substrate 50 to collect concentrated transmitted light 90 optimally, or internally-generated incident light 80 to be captured by the optical arrangement 40, and altered to control the shape and directionality of the transmitted light 90.

The different configurations of the present invention allow the translation element 65 of the optomechanical system 1 to perform only small strokes, ranging from for example from a few micrometers to a few centimeters. Such displacements are typically at least two orders of magnitude smaller than the outer size of the optomechanical system 1. The displacements could be for example of the same order of magnitude as the size of the optical elements 47. The displacements are limited to translational movements along one, two or three axes (with one, two or three degrees of freedom). Rotations are blocked or cancelled by means of a specific disposition of the guiding elements 26 combined with an arrangement of one or more actuator 25.

The mechanical structure of the shifting mechanism can be manufactured out of a single block of material by stamping, laser or water cutting, then folded into a final shape, and preferably including welding or soldering at one or more joints or points. Such manufacturing method advantageously involves less or no manual step, and the assembly is much simpler, as it can be fully automated, and is suitable for mass production. Having one single block of material, it is much easier to control the mechanical tolerances. Furthermore, the temperature of the system can be more homogenous (with lower thermal resistance). Since the system is made from a single material, there is no risk of undesirable electrochemical interactions between materials, and issues such as galvanic corrosion can be avoided.

By "luminaire", it is meant a lamp or a lighting application such as LEDs together with the parts designed to distribute the light, to position and protect the lamp and ballast. The term covers all aspects of a lighting unit, including the lamp that actually provides illumination.

By "optimally", it is meant that a value or a number of at least a quarter of the initial value or number is achieved. For example, the term "optimally absorb" means at least 25% of the transmitted light is absorbed by the light absorbing/emitting substrate, whereas "optimally transmitted" means at least 25% of the incident light is adjusted by the optical arrangement where the orientation and degree of convergence of the transmitted light is achieved at a better absorption or desired emission patterns. In some instances, the value or number is meant to be at least half of the initial value or number is achieved.

The invention claimed is:

1. An optomechanical system for absorbing light or emitting light, comprising:
    a static frame element,
    an optical arrangement comprising one or more optical layers capable of capturing incident light and transmitting transmitted light, wherein the optical arrangement is arranged to be able to capture the incident light from within and outside of the static frame element,
    a substrate with a plurality of light elements capable of absorbing the transmitted light or emitting the incident light,
    a shifting mechanism configured to move at least one of the optical layers of the optical arrangement relative to the substrate or vice versa, and
    wherein the shifting mechanism is arranged to move the at least one of the optical layers of the optical arrangement or the substrate translationally relative to the static frame element, through one or more translation elements in such a way that the transmitted light can be optimally absorbed by the substrate, or that the incident light emitted by the substrate can be optimally transmitted by the optical arrangement,
    wherein the shifting mechanism further comprises one or more guiding elements, in such a way that the one or more guiding elements are capable of limiting the degrees of freedom of the one or more translation elements,
    wherein the one or more guiding elements are arranged in such a way that the relative position of the at least one of the optical layers of the optical arrangement and the substrate can be accurately adjusted by the shifting mechanism while avoiding or minimizing relative rotations between the at least one of the optical layers of the optical arrangement and the substrate, and
    wherein an actuator is disposed between the one or more translation elements and a side wall of the static frame element, said actuator being configured to push or pull the one or more translation elements.

2. The optomechanical system according to claim 1, wherein the optical arrangement is attached to a front side of the static frame element, forming together a closed box which surrounds completely the substrate and the shifting mechanism.

3. The optomechanical system according to claim 2, wherein the optical arrangement incorporates a venting system to prevent excessive pressure to build up and/or water condensation to occur within the closed box defined by the static frame element and the optical arrangement when the external conditions are changing.

4. The optomechanical system according to claim 1, wherein the one or more guiding elements are attached between the static frame element and a first said translation element, or between a first said translation element and a second said translation element.

5. The optomechanical system according to claim 1, wherein the system further comprises a guiding module comprising a first guiding element, a second guiding element, a static attachment element, an intermediate translation element and a mobile attachment element, wherein the guiding module is arranged such that the first guiding element is attached between the static attachment element that is bound to the static frame element, and the intermediate translation element; wherein the second guiding element is arranged along an axis perpendicular to a first pair of said one or more guiding elements and attached between the intermediate translation element and the mobile attachment element bound to the one or more translation elements.

6. The optomechanical system according to claim 1, wherein at least one of the one or more guiding elements is a flexible guiding element.

7. The optomechanical system according to claim 1, wherein the system further comprises one or more sliders, arranged between the substrate and the optical arrangement, and one or more pre-constraining elements.

8. The optomechanical system according to claim 7, wherein the system further comprises sliding pads between the one or more sliders and a surface they are sliding on.

9. The optomechanical system according to claim 1, wherein the substrate is directly attached to the optical arrangement by means of the one or more guiding elements.

10. The optomechanical system according to claim 1, wherein the optical arrangement comprises at least one optical layer, comprising a plurality of optical elements or wherein the optical arrangement comprises at least two optical layers that are bonded to each other either directly or by means of an adhesive layer.

11. The optomechanical system according to claim 10, wherein the optical elements are of reflective type or refractive type.

12. The optomechanical system according to claim 10, wherein the optical elements are coated with reflective coating.

13. The optomechanical system according to claim 1, wherein the light element is a solar cell or an LED.

14. The optomechanical system according to claim 1, wherein the one or more translation elements of the shifting mechanism comprise a control system such that the at least one of the optical layers of the optical arrangement or the substrate can be moved in one or more degrees of freedom in a translational movement.

15. The optomechanical system according to claim 13, wherein two or more actuators are disposed in parallel to the same translational axis but at opposite ends of the one or more translational elements and one or more additional actuators are disposed in a direction perpendicular to said two or more actuators.

16. The optomechanical system according to claim 1, further comprising a feedback control loop to monitor a position of the one or more translation elements.

17. The optomechanical system according to claim 1, wherein the static frame element is at least partially open at its bottom and a flexible membrane seals a gap between the one or more translation elements and the static frame element while allowing the one or more translational elements to move both laterally and vertically.

18. The optomechanical system according to claim 1, wherein the at least one of the optical layers of the optical arrangement is constrained against rotation relative to the one or more translation elements.

19. An optomechanical system for absorbing light or emitting light, comprising:
- a static frame element,
- an optical arrangement comprising one or more optical layers capable of capturing incident light and transmitting transmitted light, wherein the optical arrangement is arranged to be able to capture the incident light from within and outside of the static frame element,
- a substrate with a plurality of light elements capable of absorbing the transmitted light or emitting the incident light,
- a shifting mechanism configured to move at least one of the optical layers of the optical arrangement relative to the substrate or vice versa, and wherein the shifting mechanism is arranged to move the at least one of the optical layers of the optical arrangement or the substrate translationally relative to the static frame element, through one or more translation elements in such a way that the transmitted light can be optimally absorbed by the substrate, or that the incident light emitted by the substrate can be optimally transmitted by the optical arrangement, wherein the shifting mechanism further comprises one or more guiding elements, in such a way that the one or more guiding elements are capable of limiting the degrees of freedom of the one or more translation elements, wherein the at least one of the optical layers of the optical arrangement is constrained against rotation relative to the one or more translation elements such that the relative position of the at least one of the optical layers of the optical arrangement and the substrate can be accurately adjusted by the shifting mechanism while avoiding or minimizing relative rotations between the at least one of the optical layers of the optical arrangement and the substrate.

* * * * *